US 6,734,548 B1

(12) United States Patent
Tran

(10) Patent No.: US 6,734,548 B1
(45) Date of Patent: May 11, 2004

(54) HIGH-POWER DOUBLE THROW LEVER ZIP SOCKET

(75) Inventor: Donald T. Tran, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/300,331

(22) Filed: Nov. 20, 2002

(51) Int. Cl.[7] .................. H01L 23/02; H01L 23/48; H01L 23/34; H01L 23/12; H01L 21/00

(52) U.S. Cl. .................. 257/697; 257/727; 257/730; 257/732; 257/678; 29/25.01; 439/342; 439/259; 439/261; 439/266; 439/268

(58) Field of Search .................. 257/697, 727, 257/730, 732, 678; 29/25.01; 439/342, 259, 261, 266, 268

(56) References Cited

U.S. PATENT DOCUMENTS 5,513,076 A * 4/1996 Werther .................. 361/784
5,810,609 A * 9/1998 Faraci et al. .................. 439/71
5,985,697 A * 11/1999 Chaney et al. .............. 438/122
6,016,254 A * 1/2000 Pfaff .......................... 361/769

* cited by examiner

Primary Examiner—David E. Graybill
(74) Attorney, Agent, or Firm—Schwegman, Lundberg, Woessner & Kluth, P.A.

(57) ABSTRACT

A system for providing electrical contacts between a die and an electrical device includes a package having a first major surface, a second major surface, a first scalloped edge, a second scalloped edge, and a solid end adapted for insertion into a slot. The solid end for carries power to the die or input/output signals. The scalloped edges also carry power. The package includes a plurality of electrical pins which carry input/output signals as well as power. The socket of the system includes a base having an opening therein adapted to receive the package. A cover with openings for receiving the pins covers the base. A power contact unit includes a pair of scalloped edges and a slot. The power contact unit and the cover moves with respect to the base of the socket.

27 Claims, 8 Drawing Sheets

HIGH-POWER DOUBLE THROW LEVER ZIP SOCKET

FIELD OF THE INVENTION

The present invention relates to a package for a semiconductor device and specifically to a package for semiconductor devices that use a pin grid array.

BACKGROUND OF THE INVENTION

As more and more capability is being designed into semiconductor devices, such as memory modules and microprocessors, there are an increasing number of leads or input/output elements being placed onto electronics packages. In the past, peripherally leaded packages provided an adequate number of leads or input/output elements. Peripherally leaded packages have leads or input/output elements along the edges of the electronic component. In many applications, such packages provide an adequate number of input/output elements. In the past few years, however, many semiconductor devices require more input/output elements than provided in a peripherally leaded package.

To provide additional electrical contacts for a semiconductor device, many have used a grid array package. In a grid array package the input/output elements placed on the surface of the semiconductor devices. The grid array packages have many advantages including simplicity, high contact density, and extremely low inductance due to the short paths between the contact and the element within the semiconductor device. There are several types of grid arrays. Ball grid arrays and chip scale packages have hemispherical solder balls as input/output elements. Pin grid arrays have gold plated pins as input/output elements. Land grid arrays have flat gold plated pads as input/output elements.

In general, the grid array packages are lower cost solutions than the peripherally leaded packages. Of the grid array packages, the most fragile package is the pin grid array package. The pins of the pin grid array package are prone to bending and must be protected once the package is in the socket. Once the pin grid array package is in a position where the pins are protected, the wiping distance must be sufficient to allow for good, reliable electrical contact with each of the pins.

Another problem associated with pin grid array packages is that the pin grid array packages have limited current carrying capability. Currently, the pins of the pin grid array are used either to carry input/output signals or to carry power. Simply put, the capability of the individual pins to carry power is limited due to the small size of the pins which, in turn, limits the amount of power that can be input to a die on such packages. Some electronic devices within the dies now require increased amounts of power. One such electronic device is a microprocessor. It is anticipated that the power requirements will increase further over time. The high current power levels require a larger number of pins. Adding more pins will require a larger substrate area, which is not only costly but also effects thermal and electrical performance. A larger substrate will increase the distance from the pin to the die, which will increase the trace resistance. Higher trace resistance would cause more heating within the substrate and more voltage droop. As a result, there is a need for a package so that the electronic device is not limited by the power-carrying capability associated with the pins.

There is also a growing demand for high loads and evenly distributed loads on a die package. Current pin grid array packages have difficulty in handing a high load and difficulty in distributing the load on the packages evenly. This lacking is yet another technical hurdle associated with pin grid array packages.

Thus, there is a need for a pin grid array packaging method and apparatus that overcomes the limited current carrying capability of the pins of the pin grid array package. There is also a need to assure good, reliable electrical contact between the contacts and the individual pins. There is also a need to meet the demand for high and evenly distributed die loads.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Figure 1:
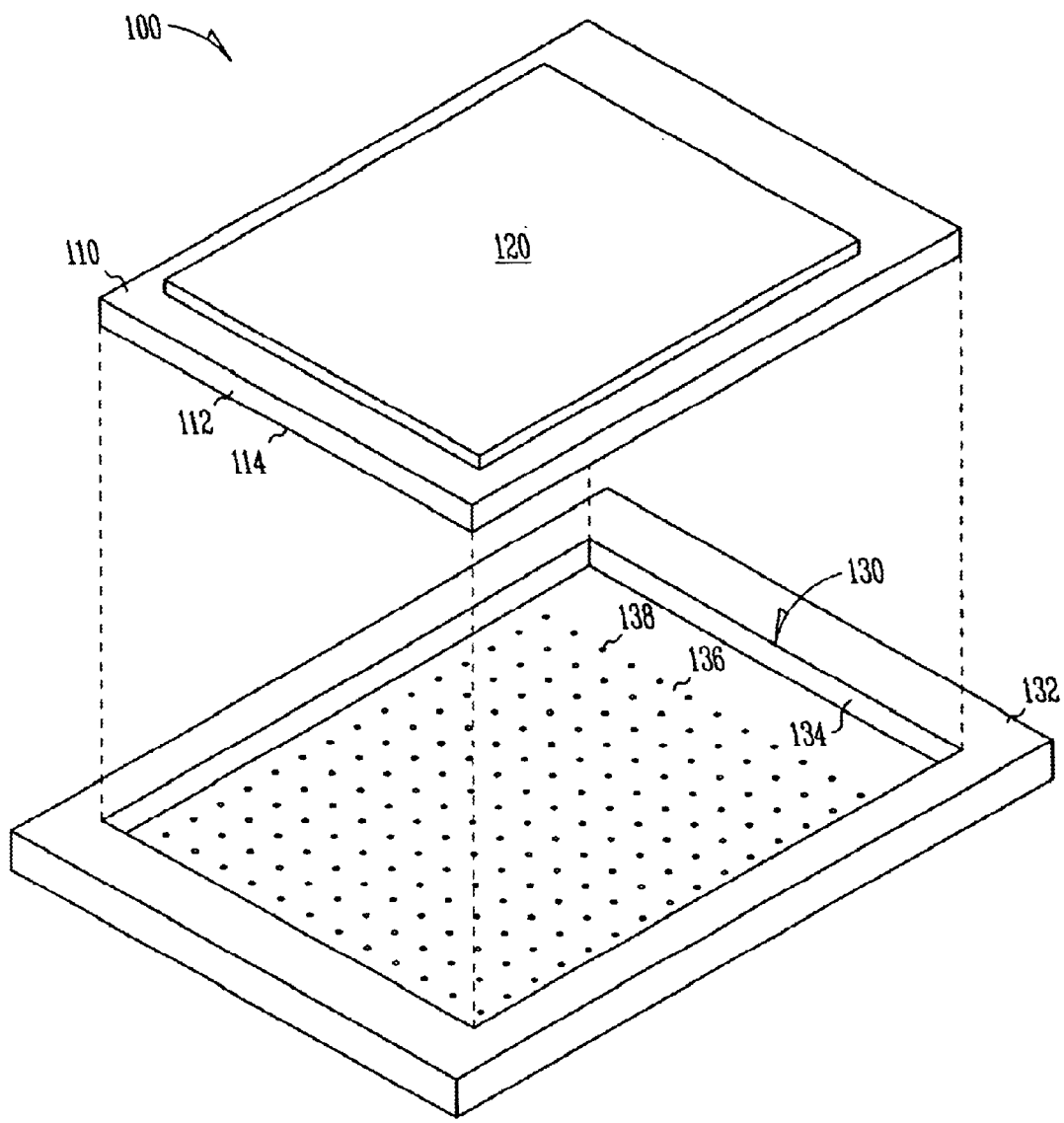
FIG. 1 illustrates a perspective view of a prior art pin grid array package.

FIG. 1 illustrates a perspective top view of a prior art land grid array package 100. The pin grid array package includes a substrate 110 to which a die 120 is attached. The substrate includes a first major surface 112 and a second major surface 114. The die 120 is attached to the first major surface 112 of the substrate 10. Located on the second major surface 114 of the substrate 110 is an array of pins. The pins carry both input/output signals to and from the electronics located within the die 120 as well as the current for power as required by the electronics within the die 120. Thus, the pin grid array type package 100 of the prior art has the pins of the pin grid array carrying both the currents necessary for power as well as input and output signal to the electronics within the die 120. The die fits within a corresponding socket 130 that includes a base 132 having an opening 134 therein. At the bottom of the opening 134 is a major surface 136, which includes a plurality of openings 138 having electrical contacts therein for contacting the pins on the major surface 114 of the pin grid array package 100.

Figure 2:
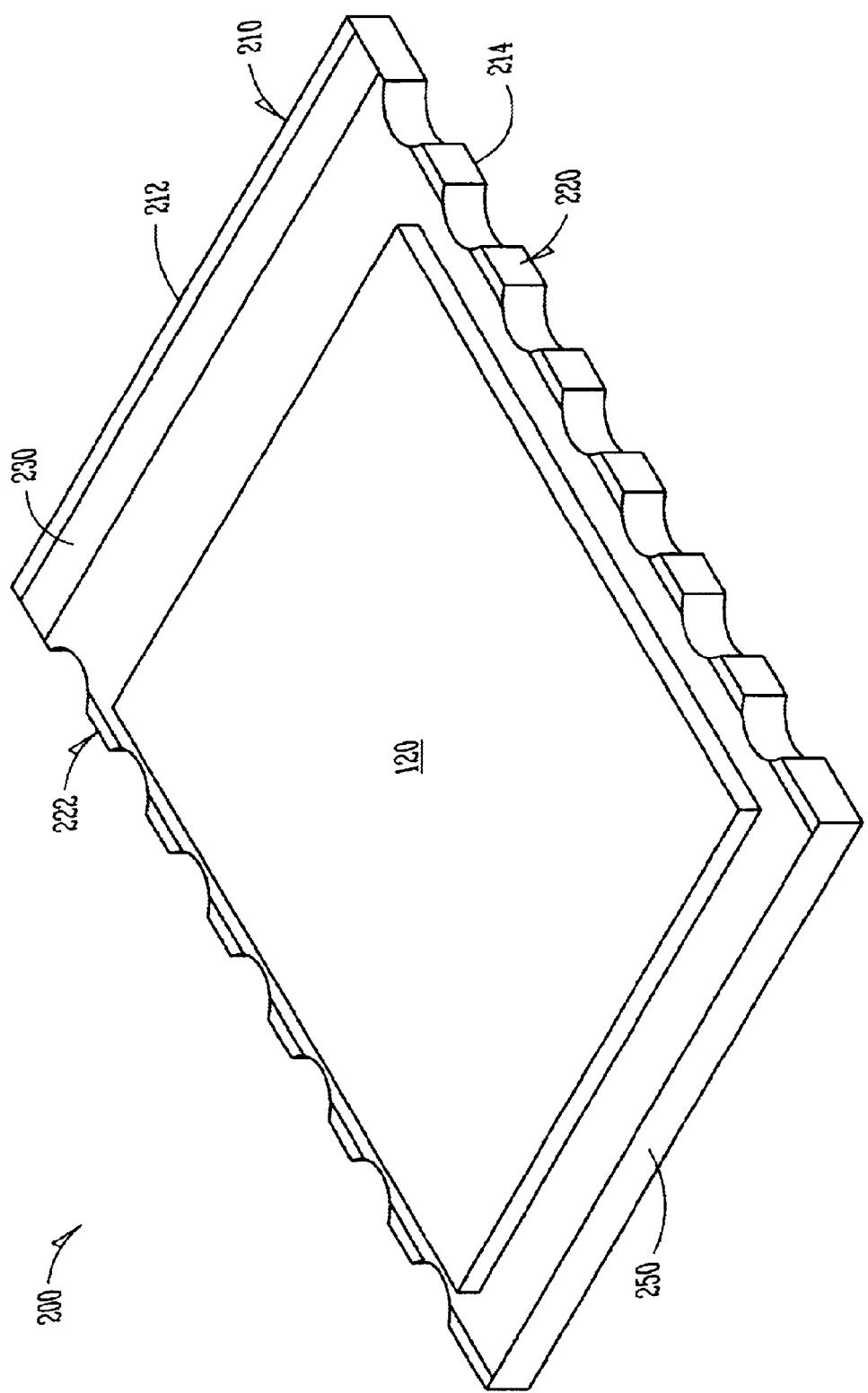
FIG. 2 illustrates a perspective view of a pin grid array package of an example embodiment of this invention.
Figure 3:
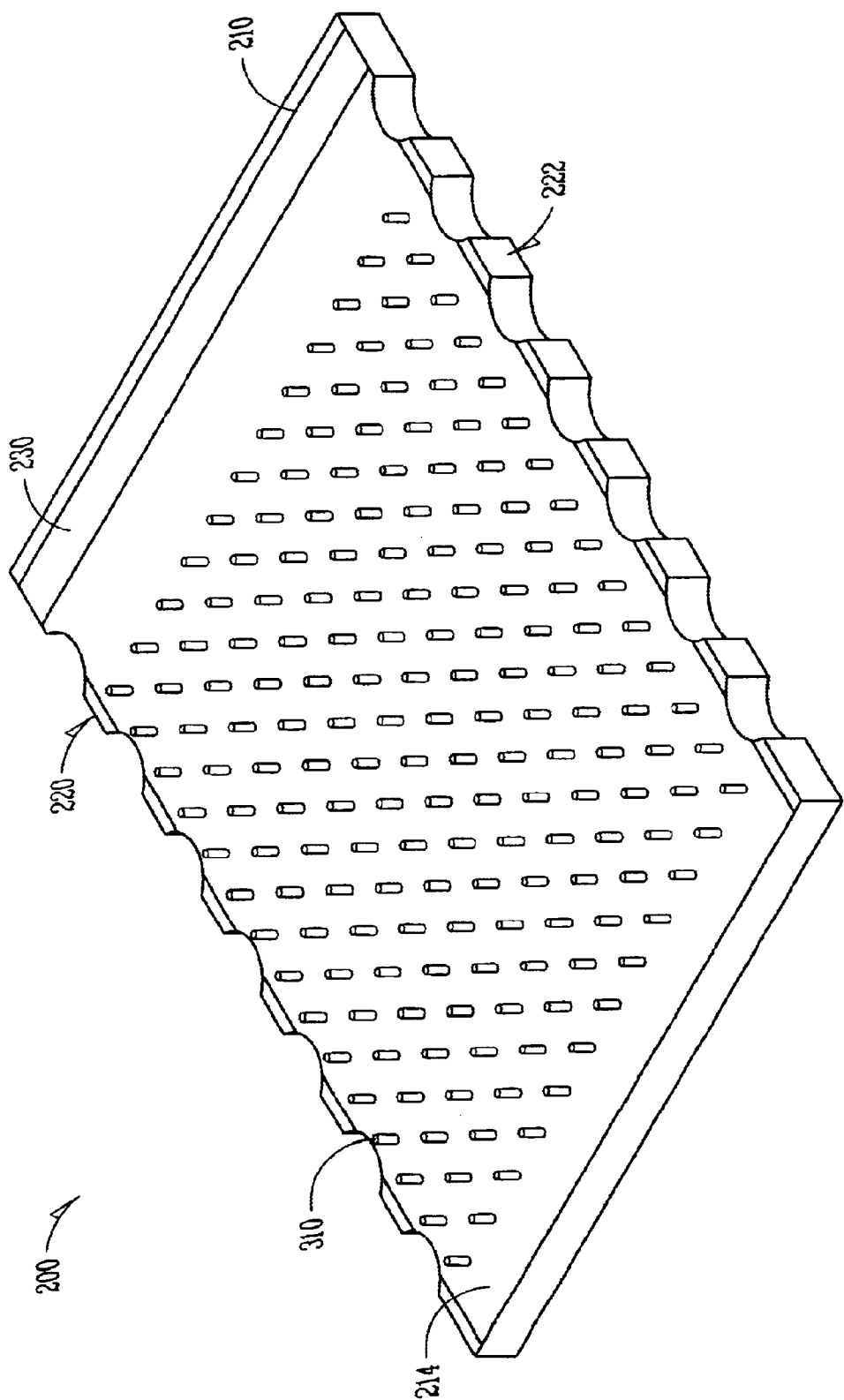
FIG. 3 illustrates a bottom perspective view of the pin grid array package of an example embodiment of this invention.

FIGS. 2 and 3 illustrate respective perspective views of a pin grid array package 200 of an example embodiment of this invention. FIG. 2 shows a top perspective view of the pin grid array package 200, and FIG. 3 illustrates a bottom perspective view of the pin grid array package 200 of an example embodiment of this invention. The pin grid array package includes a substrate 210 which has a first major surface 212 and a second major surface 214. A die 120 is attached to the first major surface 212 of the substrate 210. The die 120 includes electronics, such as a microprocessor or other semiconductor device. The die 120 includes inputs and outputs which are attached to connectors on the first major surface 212 of the substrate 210. The substrate 210 includes a first scalloped edge 220 and a second scalloped edge 222. The scalloped edges 220, 222 form a postage-stamp style edge. The substrate 210 also includes a solid end 230. The solid end 230 and the scalloped edges 220, 222 are capable of carrying high levels of current for powering the die 120 attached to the substrate 210.

FIG. 3 illustrates a bottom perspective view of the pin grid array package 200. FIG. 3 shows the first scalloped edge 220 and the second scalloped edge 222, as well as the solid elongated end 230. The second major surface 214 of the pin grid array package 200 is shown in FIG. 3. The second major surface 214 includes an array of pins 310 which are used to contact separate contacts in a corresponding socket. The corresponding socket will be discussed with respect to FIG. 4. The package 200 is advantageous in that it provides additional current input capability without adding pins nor growing the substrate size. In other words, the chip is powered by delivering higher current levels to the solid end 230 of the pin grid array package 200. The scalloped edges 220, 222 may also be used to carry higher levels of current to power the electronics within the die 120. Thus, there is less need to add pins or grow the package size. In other words, the power delivery capability is enhanced with the same number of pins and the same package substrate size.

Figure 4:
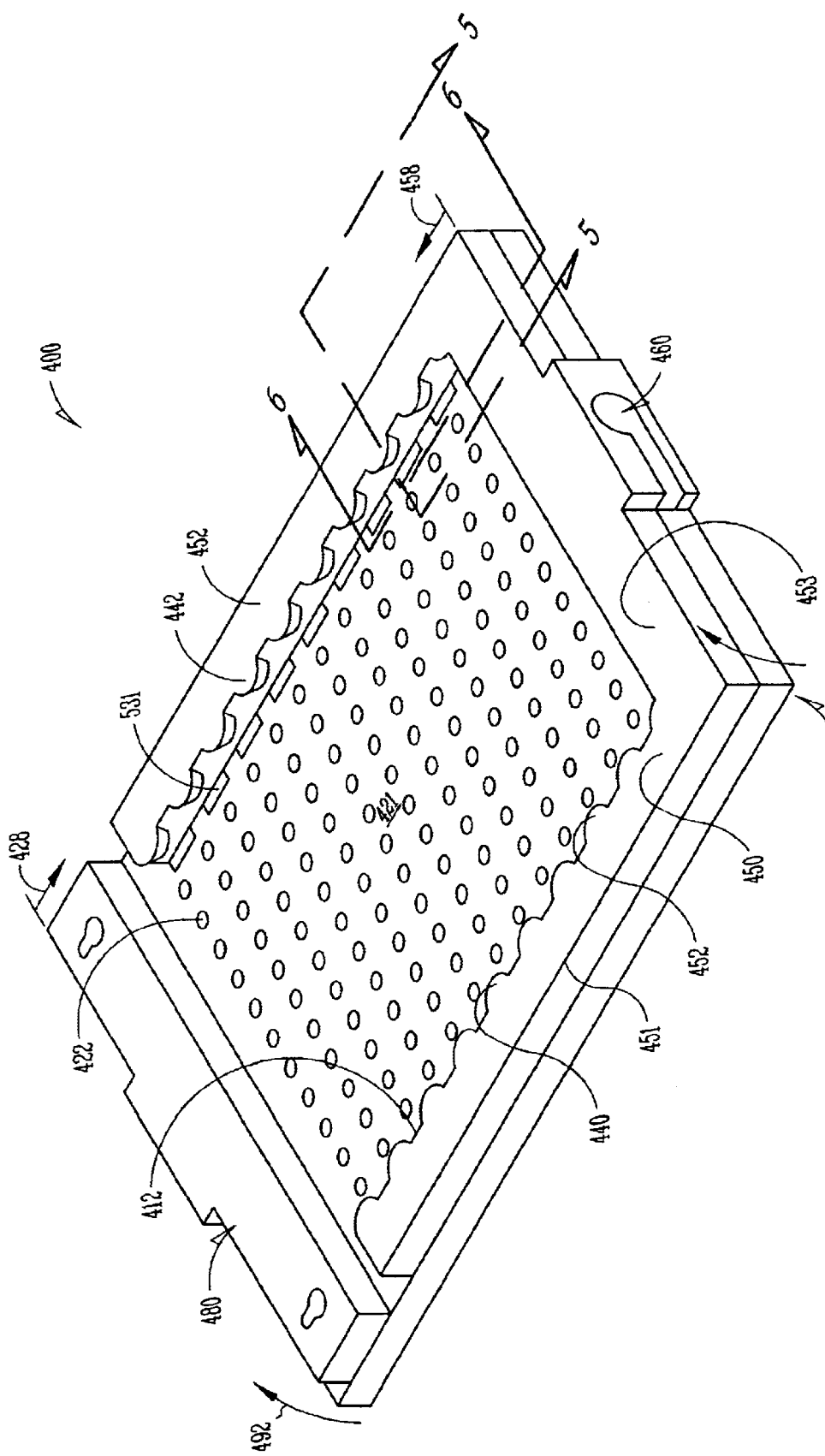
FIG. 4 illustrates a perspective view of a socket for the pin grid array package of an example embodiment of this invention.
Figure 5:
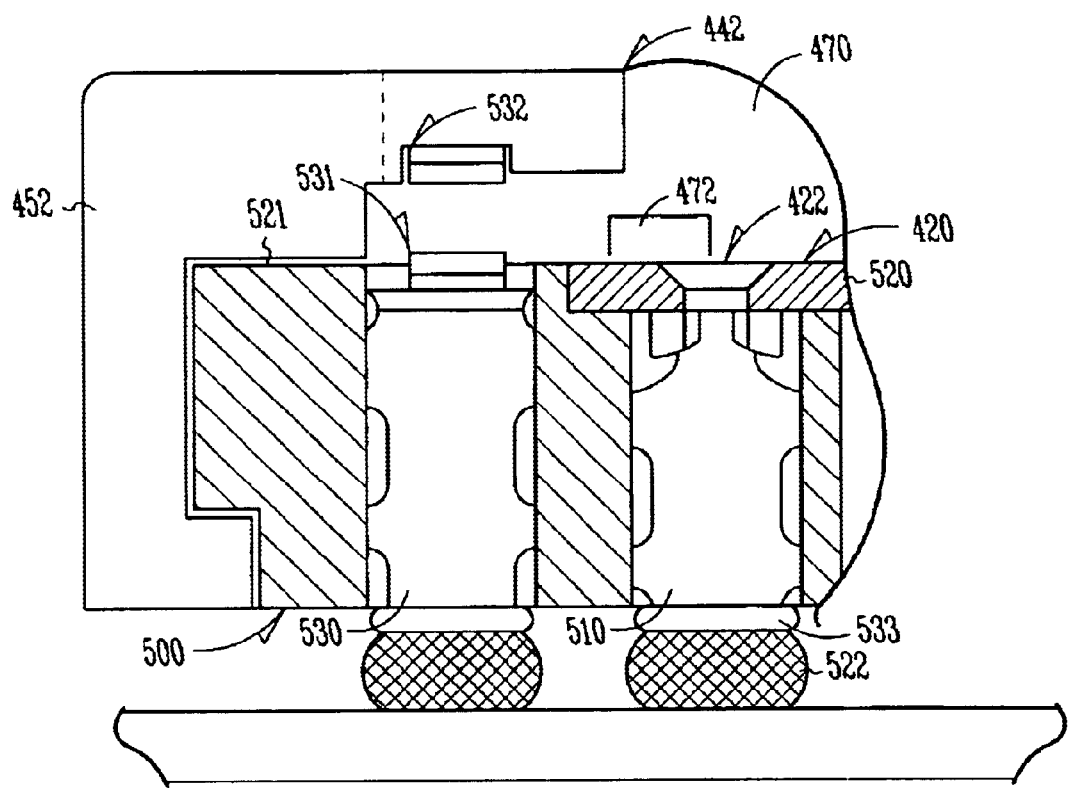
FIG. 5 illustrates a cross sectional view of the pin grid array socket along line 5—5 in FIG. 4.

FIG. 4 illustrates a perspective view of a socket 400 for the pin grid array package of an example embodiment of this invention. FIG. 5 illustrates a cross sectional view of the pin grid array socket 400 along line 5—5 in FIG. 4. The socket 400 for the pin grid array package will now be discussed with reference to FIG. 4 and FIG. 5. The pin grid array socket 400 includes a base 500, a cover 420 which has a plurality of openings 422, therein. The cover 420 slides with respect to the base 500. Underneath each opening 422 in the cover 420 is an electrical contact 510 embedded in the base 500. The electrical contacts 510 are placed in an array which corresponds to the array of openings 422 in the cover 420 and which correspond to the array of pins 310 on the major surface 214 of the pin grid array package 200 (best seen in FIG. 3).

The edge of the base 500 and cover 420 are encapsulated by a power contact unit 450. The power contact unit 450 includes a first edge 451 and a second edge 452. The first edge of the power contact unit 450 is attached to the second edge of 452 of the power contact unit by a cross member 453 that includes a power contact actuator 460. The power contact actuator 460 includes a cam which moves the power contact unit 450 with respect to the base 500 of the socket 400. The power contact actuator 460 moves the power contact unit 450 in a direction depicted by arrow 458. The cross member 453 also includes a slot for receiving the solid end 230 of the pin grid array package 200.

The cross member 453, the first edge 451 and the second edge 452 of the power contact member define an opening 412. The cover 420 is in the opening 412. The openings 422 in the cover 420 are arranged to the individual pins 310 on the pin grid array package 200. The first edge 451 of the power contact unit 450 includes a first overhang 440. As shown in FIG. 4, the first edge 451 actually includes a plurality of spaced overhangs 440. The second edge 452 of the power contact unit 450 includes a second overhang. As shown in FIG. 4, the second edge 452 actually includes a plurality of spaced overhangs 442. It should be noted that the overhangs, 440 and 442, may be single or, as shown in FIG. 4, a series or plurality of overhangs which occur upon their respective edges 451, 452. The edges 451, 452 with a plurality of spaced overhangs may also be referred to as scalloped edges 451, 452. The overhangs 440, 442 include a power contact 531. The power contacts 531 align with the power contacts 532 associated with minor surface 521 of base 500. The power contacts 531 and 532 will mate with scalloped edges 220 and 222 of the pin grid array package 200 (best seen in FIG. 3).

Figure 6:
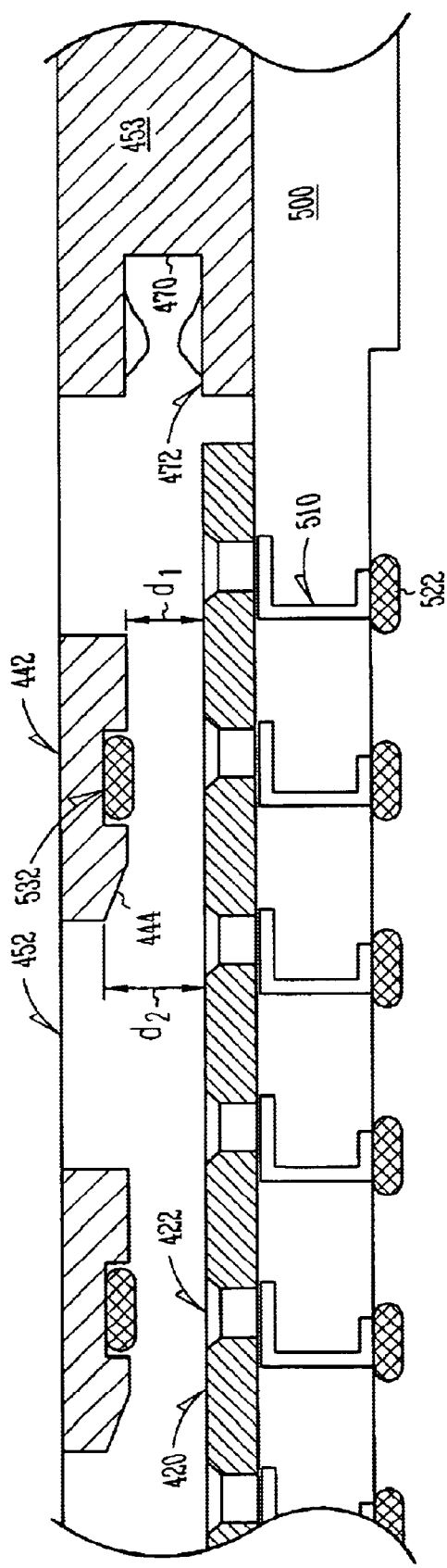
FIG. 6 illustrates a scalloped edge of the socket along line 6—6 in FIG. 4.

The cross member 453 includes a slot 470 located to receive the solid end 230 of the package 200. The slot 470 is located in the cross member 453 of the power contact unit 450. The slot 470 includes a row of electrical contacts. One electrical contact 472 is shown in FIG. 5 (FIG. 6 also shows the contacts). The number of contacts 472 are substantial enough to allow a selected level of power to be delivered to the solid end 230 of the pin grid array package 200.

The socket 400 also includes a pin field actuator 480 which moves the cover 420 with respect to the base 500. The pin field actuator 480 includes a cam which moves the cover 420 in a direction depicted by arrow 428. The cover 420 is moved in a first direction and the power contact unit 450 is moved in a second direction. The first direction is opposite the second direction. The socket 400 also includes a lever arm 490. The lever arm 490 is capable of a number of positions and moves the cam of the power contact actuator 460 which in turn moves the power contact unit 450 with respect to the base 500 and moves the cam associated with the pin field actuator 480 which in turn moves the cover 420 with respect to the base 500. The lever arm 490 moves the cams as it moves from a first position (shown in FIG. 4) along the first edge 451 of the power contact unit 450 to a second position near the second edge 452 of the power contact unit 450. An arrow 492 shows the direction of travel of the lever arm 492. The lever arm 490 is said to be a double throw lever arm since it controls the movement on two cams.

As mentioned previously, the movement of the cover 420 in one direction and the movement of the power contact unit 450 in a second direction opposite the first direction, provides for a relatively long wiping distance between the contacts 531 and 532 under the overhang 442 and the contact pad 222 associated with the package 200. The long wiping distance is advantageous since any oxide layer on the contacts 531 and 532 and pad 222 is penetrated so that a good electrical contact is achieved.

FIG. 6 illustrates a cross sectional view of the edge 452 of the power contact unit 450 of the pin grid array socket 400 of an example embodiment of this invention. The cross sectional view is taken along line 6—6 in FIG. 4. The cross-sectional view shows the edge or scalloped edge 452 of the power contact unit 450 including the overhang 442. The cross-sectional view also shows the cover 420, in contact with the major surface 520 of the base 500 as well as the individual contacts 510 underneath the cover 420 and the individual contacts 532 underneath the overhang 442. Also shown in the cross-sectional view is the slot 470 and the individual contacts 472 that are used to deliver power to the solid edge 230 of the pin grid array package 200. It should be noted that the overhang 442 includes an inclined or ramped surface 444. The ramped surface 444 is sloped. The slope of the ramped surface 444 results in varying distances between the ramped surface 444 and the major surface 421 of the socket 400. In essence, each of the overhangs 442 includes a first portion where the ramped surface 444 is located at a first distance away from the minor surface 521 of the base 500, as well as a second portion wherein the ramped surface 444 is located at a second distance from the minor surface 521 of the base 500 of the socket 400. The first distance is denoted by the reference numeral $d_1$ in FIG. 6, and the second distance is referenced by the letter $d_2$ in FIG. 6. The slope is such that the distance $d_1$ is shorter than the distance $d_2$.

Figure 7:
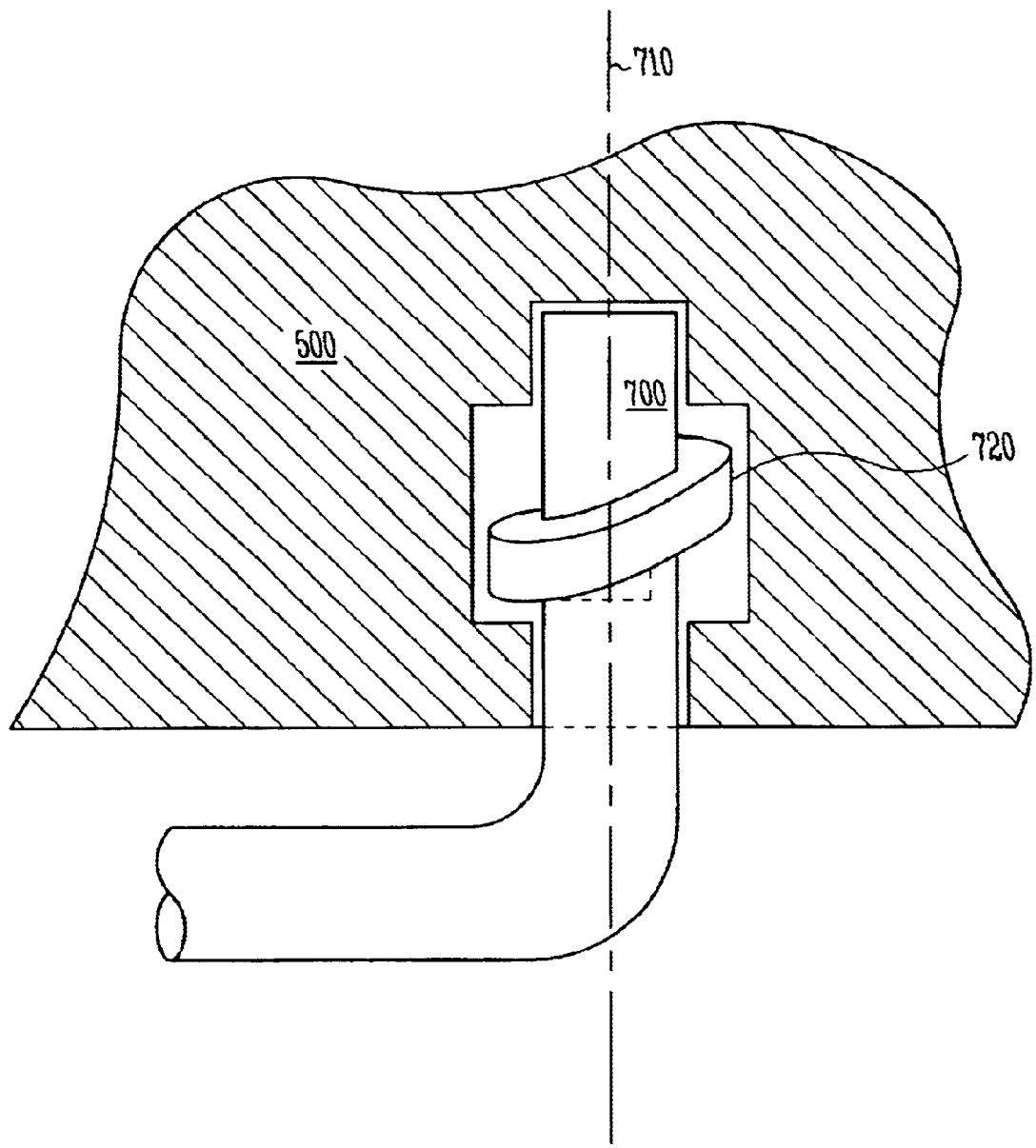
FIG. 7 illustrates a cut away view of an example embodiment of the cam of this invention.

FIG. 7 shows a cutaway view of a cam 700 of an example embodiment of this invention. This embodiment includes two cams. One cam is part of the pin field actuator 480 and the other is associated with the power contact actuator 460. Rather than describing two cams, the operation of one cam will be discussed. The cam associated with the pin field actuator 480 moves the cover while the cam associated with the power contact actuator 460 moves the row of power contacts 472 in slot 470 and the row of contacts 532 underneath the overhang 440 and 442 toward the package. A cam 700 represents both of these types of cams. Cam 700 includes an axis 710 about which the cam rotates. The cam 700 also includes a helix lobe 720 thereon. The lever arm 490 (shown in FIG. 4) is attached to the axis 710 of the cam 700. By moving the lever arm 490, the lobes will direct the pin field actuator 480 and the power contact actuator 460 toward or away from each other.

In operation, cover 420 and the power contact unit 450 are assembled over the base 500 of the socket. This forms a pocket for receiving the pin grid array package 200. The postage stamp edges 220, 222 are placed so that they pass the corresponding scalloped edges 451 and 452 of the power contact unit 450. The overhangs 440, 442 are spaced such that they fit between the scalloped indents 220, 222 of the pin grid array package 200. In other words, the scalloped edges 220, 222 of the pin grid array package fit past the overhangs 440, 442 of the edges 451, 452 of the power contact unit 450. The contacts 310 of the pin grid array package 200 are then placed into the corresponding openings 422 in the cover 420. The double throw lever 490 is then moved in the direction depicted by arrow 492. The double throw lever moves the two cams associated with the power contact actuator 460 and the pin field actuator 480. The cam associated with the pin field actuator 480 moves the cover 420 which in turn pushes the pin field 310 into contact with the contacts 510. The cam of the power contact actuator 450 moves the edges 451, 452 and the cross member 453 of the power contact actuator over the edges of the 220, 222 of the package 200. Specifically, by moving the power contact unit 450, the contacts 531 and 532 are placed into intimate electrical contact with the edges 220, 222 of the package 200 and the electrical paths associated therewith.

Initially, the pin grid array package 200 is placed in the openings 422 of the cover 420 of the socket 400. In its initial position, the solid end 230 of the pin grid array package 200 is not engaged with the slot 470 of the socket 400. Moving the double throw lever 490 not only engages the edges 220, 222 of the package with the contacts 530 of power contact edge 451 and power contact edge 452, but forces the solid end 230 of the pin grid array package 200 into the slot 470 of the socket 400. Moving the package into the slot 470 also causes the scalloped edges 220, 222 to be captured by the overhangs 440, 442. The slanted or sloped edge 444 of the overhang 442, 440 places a peripheral force above each of the edges 220, 222 of the package 200 as the pin grid array package 200 is forced into the slot 470. In other words, the cam forces the solid end 230 of the pin grid array package 200 into the slot 470 and into engagement with the contacts 472, and forces the combined pin grid array package 200 and cover 420 underneath the overhangs 440, 442 of the power contact unit 450 socket 400. This results in the solid end 230 being forced into the slot 470 and the overhangs 440, 422 place an additional force on the scalloped edges 220, 222 of the pin grid array package 200. The overhangs 440, 442 therefore produce an evenly distributed force about the periphery of the package 200 and also produce a good contact for transmission of current levels associated with powering the electronics of the die 120. By moving the cover 420 and the pin grid array package 200 across the major surface of the base 500, the wiping distance is lengthened such and an amount of force is substantially evenly placed onto the package 200. The cover 420 moves one way and the power contact unit 450 moves in the opposite direction which further increases the wiping distance. This assures good reliable contacts between the contacts 531, 532 and pad 220, 222 since the wiping distance is increased and the force between these contacts is more uniform. The increasing force makes it sure that any oxide layer on a land is penetrated to produce a good electrical contact.

Advantageously, the socket and package shown in the various example embodiments of this invention protects the pins of the package which are prone to bending. In addition, the wiping distance is sufficient to allow for good, reliable electrical contact to be made with each of the pins. The power carrying capability of the package is enhanced since power current is carried by the solid end and the scalloped edges of the package. The socket includes a slot with connectors for the solid end within the slot, and conneceters within the overhangs on the edges of the power contact unit. The problem of limited current carrying capability is now overcome since more electrical contact paths in addition to the pins are now provided. As a result, the number of pins of the pin grid array package does not have to be increased to carry more current, and there are more pins available for input and output signals. As a result, pin grid array packages can accommodate dies that require increased amounts of power and a higher number of input/output signal contacts. Microprocessors are one such electronic device that continues to have increased power requirements and it is anticipated that the power requirements will increase further over time. This pin grid array package and socket also meets the growing demand for high loads and evenly distributed loads on a die package. The pin grid array package and socket handles a high load and distributes the load on the package substantially evenly. The socket includes a pin field actuator and a power contact actuator which moves the cover in one direction and the power contact unit in another direction to provide a long wiping distance that assures a good, reliable electrical contact between the contacts and the individual pins.

Figure 8:
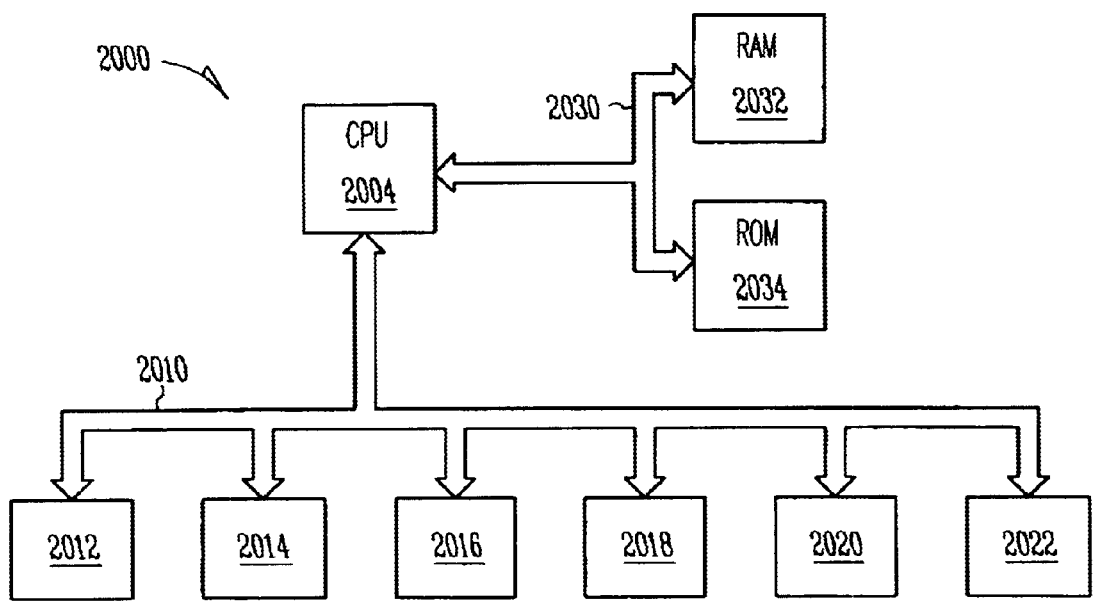
FIG. 8 illustrates a schematic view of computer system which includes of an example embodiment this invention.

FIG. 8 is a schematic view of a computer system. Advantageously, the invention, as shown by the example embodiment discussed above, is well-suited for use in a computer system 2000. The computer system 2000 may also be called an electronic system or an information handling system and includes a central processing unit, a memory and a system bus. The information handling system includes a central processing unit 2004, a random access memory 2032, and a system bus 2030 for communicatively coupling the central processing unit 2004 and the random access memory 2032. The information handling system 2000 includes packages and sockets, such as package 200 and socket 400, as described above. The information handling system 2000 may also include an input/output bus 2010 and several devices peripheral devices, such as 2012, 2014, 2016, 2018, 2020, and 2022 may be attached to the input output bus 2010. The peripheral devices may also include the package and sockets described above. Peripheral devices may include hard disc drives, magneto optical drives, floppy disc drives, monitors, keyboards and other such peripherals.

In conclusion, a system for providing electrical contacts between a die and an electrical device includes a die on a package that fits within a socket. The package for a semiconductor device includes a substrate further having a first major surface, and a second major surface. The substrate also includes a first scalloped edge, a second scalloped edge, and a solid end adapted for insertion into a slot. The first scalloped edge, the second scalloped edge and the solid end carry currents larger than the current needed for a signal. A plurality of electrical pins are attached to one of the first major surface and the second major surface. A die attached to the other of the first major surface and the second major surface of the substrate. The pins carry input/output signals. The first scalloped edge, the second scalloped edge and the solid end carry currents larger than the current needed for an input/output signal. The first scalloped edge, the second scalloped edge and the solid end have gold plating to enhance the conductivity of current. The die attached to the substrate is a microprocessor. In some embodiments, the package includes a plurality of side bar contacts.

A socket for a semiconductor device has a base having an opening therein adapted to receive a semiconductor device. The base includes a major planar surface located within the opening. The major surface includes an array of electrical contacts. The socket also includes a cover with a plurality of openings. The cover is placed on the major planar surface. The plurality of openings are adapted to receive electrical contacts. A slot is located at one end of the opening in the base. The slot includes a number of conductors for carrying additional currents or an input/output signal to or from the die attached to a package. The socket also has a first edge of the opening including a first overhang positioned over the major planar surface within the opening, and a second edge of the opening including a second overhang positioned over the major planar surface within the opening. The first overhang and second overhang are sloped with respect to the major planar surface of the base. Both the first edge and second edge include a plurality of spaced overhangs. In one embodiment, the first edge and the second edge move with respect to the major planar surface of the socket. The spacing between the plurality of spaced overhangs on the first edge and the spacing between the plurality of spaced overhangs on the second edge is sufficient to allow a package having scalloped edges to pass the overhangs for insertion into the opening in the base. The socket also includes a power contact actuator for moving the first edge and the second edge with respect to the major planar surface of the socket. The socket also includes a pin field actuator for moving the cover with respect to the major planar surface of the socket. The socket also includes double throw lever arm for moving the cover in response to one length of travel and moving the fust and second edges of the opening in response to another length of travel. The power contact actuator further includes a cam positioned on an edge of the socket. The cam has a helix surface that rotates about an axis wherein the distance between the socket and the cam surface is longer when the double throw lever is in a first position than when the cam surface is in a second position. When the double throw lever is moved, the cover moves in a first direction, and the first and second edges of the power contact actuator move in a second direction. The plurality of spaced overhangs on the first edge are sloped so that the distance between the major planar surface of the base and a particular overhang is smaller at the portion of the particular overhang nearer to the slot at one end of the opening in the base.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention, as shown and described in the example embodiments discussed above, is intended to embrace all such alternatives, modifications, equivalents and variations as fall within the spirit and broad scope of the appended claims.

What is claimed is:

1. A package for a semiconductor device comprising:
   a substrate further comprising:
      a first major surface;
      a second major surface;
      a first scalloped edge;
      a second scalloped edge;
      a solid end adapted to insert into a slot, the first scalloped edge, the second scalloped edge, the solid end to carry currents larger than the current needed for a signal;
      a plurality of electrical pins attached to one of the first major surface and the second major surface; and
      a die attached to the other of the first major surface and the second major surface of the substrate, the plurality of electrical contacts to carry input/output signals, and the first scalloped edge, the second scalloped edge and the solid end to carry currents larger than the current needed for an input/output signal.

2. The package for a semiconductor device of claim 1 wherein he first scalloped edge, the second scalloped edge and the solid end include gold plating to enhance the conductivity of current.

3. The package for a semiconductor device of claim 1 wherein the die attached to the substrate is a microprocessor.

4. The package for a semiconductor device of claim 1 wherein package includes a plurality of side bar contacts.

5. A socket for a semiconductor device comprising:
   a base having an opening therein adapted to receive a semiconductor device, the base further comprising:
      a major planar surface located within the opening, the major surface including an array of electrical contacts;
      a cover including a plurality of openings, the cover placed on the major planar surface, said plurality of openings adapted to receive electrical contacts;
      a slot located at one end of the opening in the base, the slot provided with a plurality of conductors to carry currents or signals in and out of the semiconductor;
      a first edge of the opening including a first overhang positioned over the major planar surface within the opening; and
      a second edge of the opening including a second overhang positioned over the major planar surface within the opening, the first overhang and second overhang sloped with respect to the major planar surface.

6. The socket of claim 5 wherein the first edge includes a plurality of spaced overhangs.

7. The socket of claim 6 wherein the second edge includes a plurality of spaced overhangs.

8. The socket of claim 5 wherein the first edge and the second edge move with respect to the major planar surface of the socket.

9. The socket of claim 7 wherein the spacing between the plurality of spaced overhangs on the first edge and the spacing between the plurality of spaced overhangs on the second edge is sufficient to allow insertion of a package by passing the overhangs in the opening in the base.

10. The socket of claim 8 further comprising a power contact actuator to move the first edge and the second edge with respect to the major planar surface of the socket.

11. The socket of claim 10 further comprising a pin field actuator to move the cover with to the major planar surface of the socket.

12. The socket of claim 11 further comprising a double throw lever arm to move the cover in response to one length of travel and moving the first and second edges of the opening in response to another length of travel.

13. The socket of claim 8 wherein the power contact actuator further comprises a cam positioned on an edge of the socket, the cam having a cam surface that rotates about an axis wherein the distance between the socket and the cam surface is longer when the lever is in a first position than when the cam surface is in a second position.

14. The socket of claim 11 wherein the cover moves in a first direction in and the first and second edges of the power contact actuator move in a second direction.

15. The socket of claim 7 wherein the plurality of spaced overhangs on the first edge are sloped so that the distance between the major planar surface of the base and a particular overhang is smaller at the portion of the particular overhang nearer to the slot at one end of the opening in the base.

16. A system for providing electrical contacts between a die and an electrical device, the system comprising:
  a package further comprising:
    a first major surface;
    a second major surface;
    a first scalloped edge;
    a second scalloped edge;
    a solid end adapted to be inserted into a slot, the solid end to carry currents larger than the current needed for an input/output signal;
    a plurality of electrical pins attached to one of the first major surface and the second major surface; and
    a die attached to the other of the first major surface and the second major surface of the substrate; and
  a socket comprising:
    a base having an opening therein adapted to receive a semiconductor device, the base further comprising:
      a major planar surface located within the opening, the major surface including an array of electrical contacts;
      a cover including a plurality of openings, the cover placed on the major planar surface, said plurality of openings adapted to receive electrical contacts;
      a slot located at one end of the opening in the base, the slot provided with a plurality of conductors to carry currents or signals in and out of the package;
      a first edge of the opening including a first overhang positioned over the major planar surface within the opening; and
      a second edge of the opening including a second overhang positioned over the major planar surface within the opening, wherein the first overhang and second overhang are spaced to correspond to the first scalloped edge and the second scalloped edge of the package.

17. The system of claim 16 wherein the first overhang and second overhang are sloped with respect to the major planar surface.

18. The system of claim 16 wherein the first overhang and second overhang are sloped with respect to the major planar surface, wherein the slope of at least one of the overhangs results in the distance between a portion nearer the slot being less than a portion of the overhang more distal from the slot.

19. The system of claim 17 wherein the first overhang and second overhang are sloped so as to force the package toward the major planar surface of the opening when the package is moved toward the slot at one end of the opening.

20. The system of claim 16 wherein the first overhang and second overhang include electrical contacts adapted to carry currents or signals in and out of the package.

21. The system of claim 20 wherein the pins attached to one of the first major surface and the second major surface of the package carry input/output signals.

22. The system of claim 16 wherein the first edge and the second edge of the socket move with respect to the major planar surface of the socket.

23. The system of claim 22 further comprising a power contact actuator to move the first edge and the second edge with respect to the major planar surface of the socket.

24. The system of claim 23 further comprising a pin field actuator for moving the cover with respect to the major planar surface of the socket.

25. The system of claim 24 further comprising a down throw lever arm that moves the cover in response to one length of travel and moves the first and second edges of the opening in response to another length of travel.

26. The system of claim 24 wherein the cover is moved by the pin field actuator in a first direction and the first edge and second edges of the opening travel in a second direction.

27. The system of claim 16 positioned within an information handling system.

* * * * *

UNITED STATES PATENT AND TRADEMARK OFFICE
CERTIFICATE OF CORRECTION

PATENT NO. : 6,734,548 B1
DATED : May 11, 2004
INVENTOR(S) : Tran

It is certified that error appears in the above-identified patent and that said Letters Patent is hereby corrected as shown below:

Title page,
Item [57], ABSTRACT
Line 5, after "end" delete "for".

Column 8,
Line 41, delete "he" and insert -- the --, therefor.

Column 9,
Line 17, after "with" insert -- respect --.
Line 30, after "direction" delete "in".

Signed and Sealed this

Nineteenth Day of April, 2005

JON W. DUDAS
*Director of the United States Patent and Trademark Office*